(12) United States Patent
Wang

(10) Patent No.: US 11,810,860 B2
(45) Date of Patent: Nov. 7, 2023

(54) SEMICONDUCTOR DEVICE WITH CONDUCTIVE STRUCTURE AND INSULATION LAYER OF DIFFERENT WIDTH

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 305 days.

(21) Appl. No.: 17/249,011

(22) Filed: Feb. 17, 2021

(65) Prior Publication Data

US 2021/0167071 A1 Jun. 3, 2021

Related U.S. Application Data

(62) Division of application No. 16/536,684, filed on Aug. 9, 2019, now Pat. No. 10,957,700.

(30) Foreign Application Priority Data

Aug. 29, 2018 (CN) .......................... 201810993203.3

(51) Int. Cl.
*H01L 23/532* (2006.01)
*H01L 29/66* (2006.01)
(Continued)

(52) U.S. Cl.
CPC .. *H01L 23/53295* (2013.01); *H01L 21/31116* (2013.01); *H01L 21/31144* (2013.01);
(Continued)

(58) Field of Classification Search
None
See application file for complete search history.

(56) References Cited

U.S. PATENT DOCUMENTS 5,973,360 A * 10/1999 Tihanyi ............... H01L 29/0634
257/330
9,397,099 B1 * 7/2016 Huang ................. H01L 29/785
(Continued)

*Primary Examiner* — Scott B Geyer
(74) *Attorney, Agent, or Firm* — Anova Law Group, PLLC

(57) ABSTRACT

A semiconductor device is provided. The semiconductor device includes a base substrate; and a first gate structure and doped source/drain layers on the base substrate. The doped source/drain layers are on both sides of the first gate structure. The semiconductor device further includes a dielectric layer on a surface of the base substrate. The dielectric layer covers the doped source/drain layers, and the dielectric layer contains a first trench on the doped source/drain layer. The first trench includes a first region filled by an insulation layer and a second region filled by first conductive structure under the insulation layer. A top size of the insulation layer in the first region is larger than a bottom size of the insulation layer in the first region. A maximum size of the first conductive structure in the second region is smaller than the bottom size of the insulation layer in the first region.

15 Claims, 10 Drawing Sheets

(51) Int. Cl.

| | |
|---|---|
| *H01L 29/40* | (2006.01) |
| *H01L 21/8234* | (2006.01) |
| *H01L 21/311* | (2006.01) |
| *H01L 27/088* | (2006.01) |
| *H01L 21/762* | (2006.01) |
| *H01L 21/768* | (2006.01) |
| *H10B 10/00* | (2023.01) |
| *H01L 29/06* | (2006.01) |
| *H01L 29/417* | (2006.01) |
| *H01L 29/08* | (2006.01) |

(52) U.S. Cl.
CPC .. *H01L 21/76224* (2013.01); *H01L 21/76804* (2013.01); *H01L 21/76816* (2013.01); *H01L 21/823418* (2013.01); *H01L 21/823431* (2013.01); *H01L 21/823437* (2013.01); *H01L 21/823481* (2013.01); *H01L 27/0886* (2013.01); *H01L 29/0653* (2013.01); *H01L 29/401* (2013.01); *H01L 29/41791* (2013.01); *H01L 29/6656* (2013.01); *H01L 29/66545* (2013.01); *H10B 10/12* (2023.02); *H01L 29/086* (2013.01); *H01L 29/0878* (2013.01)

(56) References Cited

U.S. PATENT DOCUMENTS

| | | | |
|---|---|---|---|
| 10,074,558 B1* | 9/2018 | Tsai | H01L 21/76897 |
| 10,553,582 B2* | 2/2020 | Kim | H01L 21/31116 |
| 10,566,201 B1* | 2/2020 | Park | H01L 21/28123 |
| 2013/0154026 A1 | 6/2013 | Alptekin et al. | |
| 2016/0049394 A1 | 2/2016 | Shin et al. | |
| 2016/0111506 A1 | 4/2016 | Lee et al. | |
| 2016/0211251 A1* | 7/2016 | Liaw | H01L 29/41791 |
| 2016/0276213 A1 | 9/2016 | Li et al. | |
| 2016/0315045 A1 | 10/2016 | Baek et al. | |
| 2016/0372547 A1* | 12/2016 | Glass | H01L 21/76831 |
| 2017/0047257 A1 | 2/2017 | Han et al. | |
| 2017/0141107 A1* | 5/2017 | Kim | H01L 21/823431 |
| 2017/0179242 A1* | 6/2017 | Chang | H01L 29/401 |
| 2017/0330937 A1* | 11/2017 | Hsieh | H01L 29/41783 |
| 2018/0026032 A1* | 1/2018 | Yoon | H01L 29/7848 |
| | | | 257/401 |
| 2018/0033728 A1 | 2/2018 | Zhang et al. | |
| 2018/0040558 A1* | 2/2018 | Hung | H01L 27/0207 |
| 2018/0069124 A1 | 3/2018 | Cheng | H01L 21/823418 |
| 2018/0175171 A1* | 6/2018 | Lo | H01L 29/6656 |
| 2018/0182845 A1* | 6/2018 | Seong | H01L 21/823871 |
| 2018/0190785 A1* | 7/2018 | Hung | H01L 21/823431 |
| 2018/0190809 A1 | 7/2018 | Huang et al. | |
| 2018/0286956 A1* | 10/2018 | Xie | H01L 27/0924 |
| 2018/0315854 A1* | 11/2018 | Liaw | H01L 21/76816 |
| 2019/0067124 A1 | 2/2019 | Tsai et al. | |
| 2019/0097006 A1* | 3/2019 | Li | H01L 29/41725 |
| 2019/0122940 A1* | 4/2019 | Chang | H01L 21/823481 |
| 2019/0131421 A1 | 5/2019 | Shen et al. | |
| 2019/0139955 A1 | 5/2019 | Kim et al. | |
| 2019/0148374 A1 | 5/2019 | Bae et al. | |
| 2019/0172752 A1* | 6/2019 | Hsu | H01L 21/31144 |
| 2019/0295889 A1 | 9/2019 | Bai et al. | |
| 2019/0295898 A1* | 9/2019 | Xie | H01L 21/823431 |
| 2019/0296124 A1 | 9/2019 | Hsu et al. | |
| 2019/0363085 A1* | 11/2019 | Oh | H01L 21/823431 |
| 2019/0393318 A1* | 12/2019 | Chung | H01L 29/0847 |
| 2020/0006127 A1* | 1/2020 | Khaderbad | H01L 21/76834 |
| 2020/0075339 A1* | 3/2020 | Tsai | H01L 21/76814 |
| 2020/0105867 A1* | 4/2020 | Lee | H01L 21/823864 |
| 2020/0119180 A1* | 4/2020 | Frougier | H01L 21/823418 |
| 2020/0127089 A1* | 4/2020 | Hsu | H01L 29/66575 |
| 2020/0176574 A1 | 6/2020 | Huang et al. | |
| 2020/0266286 A1 | 8/2020 | Yang et al. | |
| 2020/0303261 A1 | 9/2020 | Shen et al. | |
| 2020/0335594 A1* | 10/2020 | Zang | H01L 27/088 |
| 2020/0395465 A1* | 12/2020 | Yang | H01L 29/785 |

* cited by examiner

SEMICONDUCTOR DEVICE WITH CONDUCTIVE STRUCTURE AND INSULATION LAYER OF DIFFERENT WIDTH

CROSS-REFERENCE TO RELATED APPLICATION

This application is a divisional application of U.S. patent application Ser. No. 16/536,684, filed on Aug. 9, 2019, which claims the priority of Chinese Patent Application No. 201810993203.3, filed on Aug. 29, 2018, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

With continuous development of the semiconductor technology, the memory may develop a trend with high integration, high speed and low power consumption.

The memory may be categorized into random-access memory (RAM) and read-only memory (ROM) according to the function. When RAM operates, data may be read from any specified address at any time, and data may be written to any specified storage unit at any time. RAM may be convenient to read, write, and be flexible to use.

RAM may be categorized into static random-access memory (SRAM) and dynamic random-access memory (DRAM). SRAM may use a trigger with positive feedback to implement data storage, and mainly rely on continuous power supply to maintain data integrity. SRAM may not need to be refreshed in use and have been widely used in computer's high-speed caching and frequent data processing.

However, SRAM in the conventional technology may have poor electrical performance.

SUMMARY

One aspect of the present disclosure provides a method for fabricating a semiconductor device. The method includes: providing a base substrate; forming a first gate structure and doped source/drain layers on the base substrate, where the doped source/drain layers are on both sides of the first gate structure; forming a dielectric layer, covering the doped source/drain layers, on a surface of the base substrate; forming a first trench, on the doped source/drain layers, through the dielectric layer; forming a first conductive structure in the second region of the first trench; after forming the first conductive structure, forming an insulation layer in the first region of the first trench, where a material of the insulation layer is different from a material of the dielectric layer; forming a recess, exposing the first gate structure, in the dielectric layer using the insulation layer as a mask; and forming a second conductive structure in the recess. The first trench includes a first region and a second region under the first region; a top size of the first region is larger than a bottom size of the first region; a maximum size of the second region is smaller than or equal to the bottom size of the first region; a sidewall of the first region is tilted; and an angle between the sidewall of the first region and the surface of the base substrate is a first angle including an obtuse angle;

Another aspect of the present disclosure includes a semiconductor device fabricated by embodiments of the present disclosure. The semiconductor device includes: a base substrate; a first gate structure and doped source/drain layers on the base substrate, where the doped source/drain layers are on both sides of the first gate structure; a dielectric layer on a surface of the base substrate, where the dielectric layer covers the doped source/drain layers, and the dielectric layer contains a first trench on the doped source/drain layer. The first trench includes a first region filled by an insulation layer and a second region filled by first conductive structure under the insulation layer; a top size of the insulation layer in the first region is larger than a bottom size of the insulation layer in the first region; a maximum size of the first conductive structure in the second region is smaller than the bottom size of the insulation layer in the first region; a sidewall of the insulation layer in the first region is tilted; and an angle between the sidewall of the insulation layer in the first region and a surface of the base substrate is a first angle including an obtuse angle; a material of the insulation layer is different from a material of the dielectric layer; and a second conductive structure is in the dielectric layer between insulation layers over adjacent doped source/drain layers, where the second conductive structure is connected to the first gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor device and its fabrication method are provided. The method includes: providing a base substrate; forming a first gate structure and doped source/drain layers on the base substrate; forming a dielectric layer on a surface of the base substrate; forming a first trench, on the doped source/drain layers, through the dielectric layer, where the first trench includes a first region and a second region under the first region, and an angle between a sidewall of the first region and the surface of the base substrate is a first angle; forming a first conductive structure in the second region of the first trench; after forming the first conductive structure, forming an insulation layer in the first region of the first trench; forming a recess, exposing the first gate structure, in the dielectric layer using the insulation layer as a mask; and forming a second conductive structure in the recess.

Figure 1:
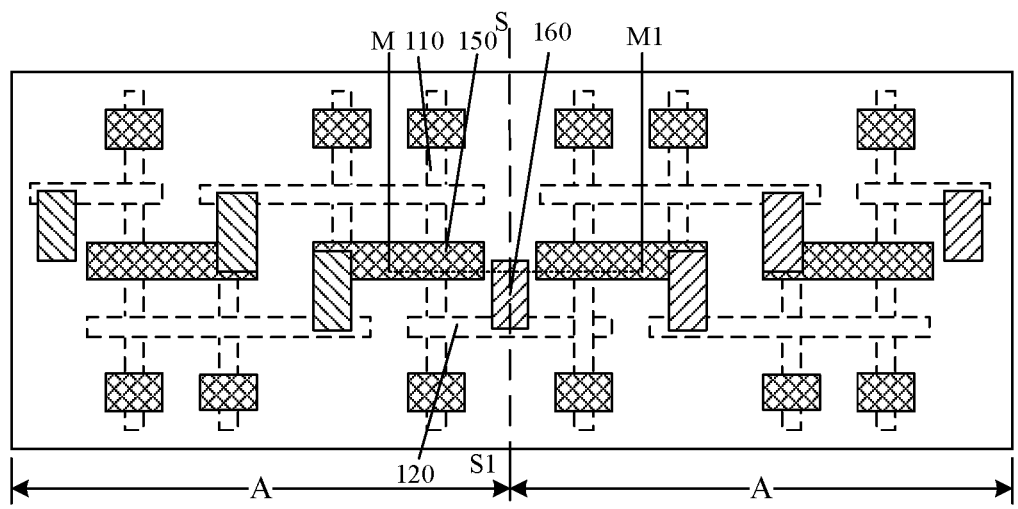
FIGS. 1-2 illustrate structural schematics corresponding to an exemplary SRAM device.
Figure 2:
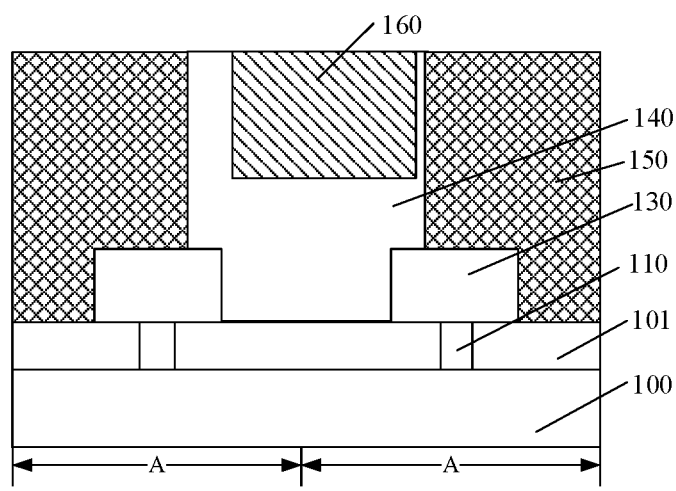

FIGS. 1-2 illustrate structural schematics corresponding to an exemplary SRAM device.

Referring to FIGS. 1-2, FIG. 1 illustrates a top-view schematic of a semiconductor device, and FIG. 2 illustrates a cross-sectional schematic along a cut line M-M1 in FIG. 1. A substrate 100 may be provided and include adjacent device regions A which may be mirror connected along an axis S-S1. A surface of the substrate 100 of the device regions A may have fins 110 and an isolation layer 101, where the isolation layer 101 may cover a portion of sidewalls of the fins 110, and the fins 110 of the adjacent device regions A may be adjacent to each other. A gate structure 120 may cross the adjacent fins 110 of the adjacent device regions A. Doped source/drain layers 130 may be in the fins 110 on both sides of the gate structure 120 of the device regions A, and at least one doped source/drain layer 130 may be adjacent to another doped source/drain layer 130 of the adjacent device region A. A dielectric layer 140 above the substrate may cover the top surfaces of the doped source/drain layers 130 and also cover the top and sidewall surfaces of the gate structure 120. A first conductive structure 150 and a second conductive structure 160 may in the dielectric layer 140. The first conductive structure 150 may across the doped source/drain layers 130 and cover a portion of the top and sidewall surfaces of the doped source/drain layers 130. The second conductive structure 160 may cover a portion of a top surface of the first gate structure 120.

In the above-mentioned semiconductor device, the first conductive structure may be used to connect a first metal interconnect layer to the doped source/drain layer, and the second conductive structure may be used to connect the first metal interconnect layer to the gate structure. After forming the first conductive structure, the second conductive structure may be formed. When forming the second conductive structure, a photolithography process may be required to form a trench. The position of the trench may be misaligned due to the precision limitation of the photolithography process, so distances between the trench and each of the two adjacent first conductive structures 150 may not be equal. If the dielectric layer between the second conductive structure 160 and the first conductive structure 150 is too thin, leakage may be caused easily. Especially, when the trench is greatly misaligned, a bridging between the first conductive structure 150 and the second conductive structure 160 may also be formed easily, which may result in poor performance of the formed semiconductor device.

The present disclosure provides a fabrication method of a semiconductor device. A first trench may be formed in a dielectric layer, where a top size of a first region of the first trench may be larger than a bottom size of the first region of the first trench, and a maximum size of a second region of the first trench may be smaller than the bottom size of the first region. A first conductive structure may be formed in the second region of the first trench. An insulation layer may be formed in the first region of the first trench. A recess may be formed using the insulation layer as a mask, that is, a top position of the insulation layer may determine a position of the second conductive structure, so a distance between the first conductive structure and the second conductive structure may be greater than zero, and the isolation between the first conductive structure and the second conductive structure may be better. It can be seen that by controlling the top size and bottom size of the first region, the minimum distance between the first conductive structure and the second conductive structure may be adjusted to prevent leakage between the first conductive structure and the second structure. Meanwhile, the insulation layer may cover a surface of the first conductive structure to prevent the first conductive structure from being short-circuited with the second conductive structure, which may improve the performance of the semiconductor device.

In order to further illustrate the above described objects, features, and advantages of the present disclosure, various specific embodiments of the present disclosure will be described in detail below with reference to the accompanying drawings.

FIGS. 3-17 illustrate structural schematics corresponding to certain stages for forming an exemplary semiconductor device according to various disclosed embodiments of the present disclosure. FIG. 18 illustrates a flowchart of an exemplary fabrication method for forming a semiconductor structure according to various disclosed embodiments of the present disclosure.

Figure 3:
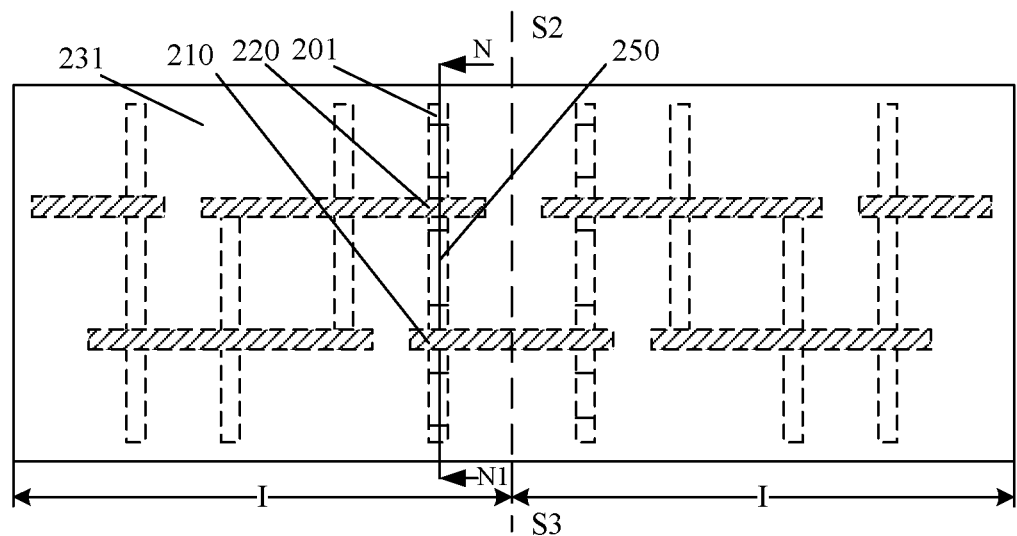
FIGS. 3-17 illustrate structural schematics corresponding to certain stages for forming an exemplary semiconductor device according to various disclosed embodiments of the present disclosure.
Figure 4:
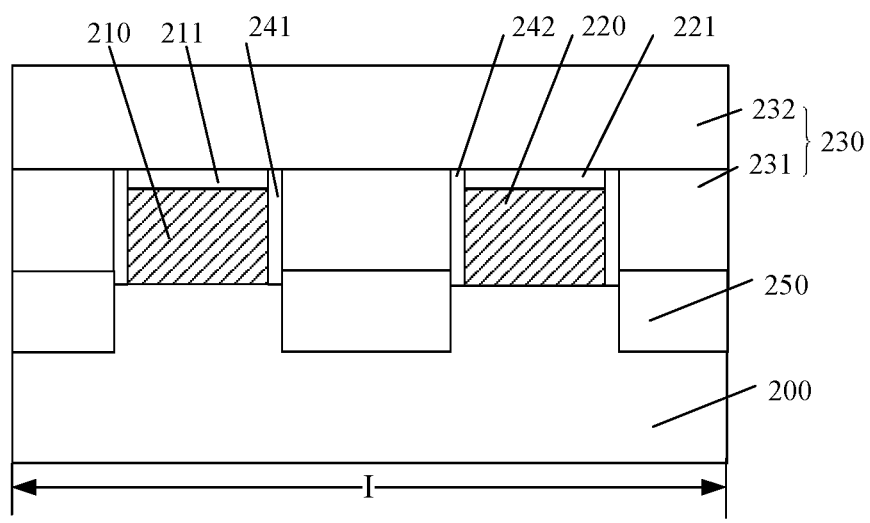

Referring to FIGS. 3-4, FIG. 3 illustrates a top-view schematic of a semiconductor device, and FIG. 4 illustrates a cross-sectional schematic along a cut line N-N1 in FIG. 3. A base substrate may be provided (e.g., in S401 of FIG. 18).

In one embodiment, the base substrate may include adjacent device regions I. Although only two adjacent device regions I of the semiconductor device are illustrated in FIG. 3, any number of adjacent device regions may be included in the present disclosure. In one embodiment, the adjacent device regions I may be mirror distributed along an axis S2-S3 as shown in FIG. 3.

In one embodiment, the device regions I may be used to form the static random-access memory.

In other embodiments, the device regions I may be used to form a p-channel metal-oxide-semiconductor (PMOS) transistor or an n-channel metal-oxide-semiconductor (NMOS) transistor.

The base substrate may include a semiconductor substrate 200.

The semiconductor substrate 200 may be made of a material including silicon, germanium, silicon germanium, gallium arsenide, indium gallium arsenide, or any other suitable material(s), where the silicon may include monocrystalline silicon, polycrystalline silicon or amorphous silicon. The semiconductor substrate 200 may also be a semiconductor-on-insulator (SOI) structure. The semiconductor-on-insulator structure may include an insulator and semiconductor material layers on the insulator, where the semiconductor material layer may be made of a material including silicon, germanium, silicon germanium, gallium arsenide, indium gallium arsenide, or any other suitable material(s).

In one embodiment, the material of the semiconductor substrate 200 may be monocrystalline silicon.

Each device region of the base substrate may have first fins. The first fins respectively located at adjacent device regions may be adjacent to each other.

In one embodiment, the device regions I of the semiconductor substrate 200 may have first fins 201, and the first fins 201 respectively located at adjacent device regions I may be adjacent to each other.

A first gate structure and doped source/drain layers may be formed on the base substrate, and the doped source/drain layers may be on both sides of the first gate structure (e.g., in S402 of FIG. 18).

In one embodiment, the first gate structure 210 may cross the adjacent first fins 201 of the adjacent device regions I. The first gate structure 210 may cover a portion of the top surfaces and sidewall surfaces of the adjacent first fins 201. The doped source/drain layers 250 may be in the first fins 201 on both sides of the first gate structure 210 of the device region I. At least one doped source/drain layer 250 may be adjacent to another doped source/drain layer 250 of the adjacent device region.

In one embodiment, the fabrication method may further include: forming a second gate structure 220 on the device region I of the semiconductor 200. The second gate structure 220 may cross the first fins 201 and cover a portion of the top surfaces and sidewall surfaces of the first fins 201. The doped source/drain layers 250 may be in the first fins 201 on both sides of the second gate structure 210.

In one embodiment, the first fins 201 may be used as fins of a pass transistor and a pull-down transistor.

In one embodiment, the fabrication method may further include: forming second fins on a surface of the substrate 200 on the both sides of the first fins 201 of the adjacent device regions I. The second gate structure 220 may cross the first fins 201 and the second fins and may cover a portion of the top surfaces and sidewall surfaces of the second fins. The second fins may be used as fins of a pull-down transistor.

In other embodiments, the second fins may be used as fins of other transistors which may be an NMOS transistor or a PMOS transistor.

In one embodiment, the first fins 201 and the second fins may be formed by patterning the semiconductor substrate 200. In other embodiments, a first fin material layer may be formed on the semiconductor substrate 200. Then, the first fin material layer may be patterned to form the first fins 201 and the second fins.

In one embodiment, the material of the first fins 201 and the second fins may be monocrystalline silicon. In other embodiments, the material of the first fins 201 may be monocrystalline silicon germanium or any other suitable semiconductor material(s).

In one embodiment, the fabrication method may further include: forming an isolation layer 202 subsequently (shown in FIG. 8) on the semiconductor substrate 200. The isolation layer 202 may extend from a device region I to an adjacent device region I and may cover a portion of the sidewall surfaces of the first fins 201 and the second fins. The isolation layer 202 may be made of a material including silicon oxide.

In one embodiment, the first gate structure 210 and the second gate structure 220 may include a gate dielectric layer and a gate electrode layer on the gate dielectric layer. The gate dielectric layer may be made of a high K (K greater than 3.9) dielectric material. The gate electrode layer may be made of a metal including tungsten.

The top of the first gate structure 210 may have a first gate protection layer 211.

The top of the second gate structure 220 may have a second gate protection layer 221.

In one embodiment, a dielectric layer 230 may include a first interlayer dielectric layer 231 and a second interlayer dielectric layer 232. The first interlayer dielectric layer 231 may cover the sidewalls of the first gate structure 210 and the second gate structure 220. The second interlayer dielectric layer 232 may cover the top surfaces of the first gate structure 210 and the second gate structure 220.

The fabrication method of forming the first gate structure 210 may include: forming a first dummy gate structure extending from a device region to an adjacent device region on the substrate 200 of the device regions I, where the first dummy gate structure may cross the first fins 201 of two adjacent device regions I; forming the first interlayer dielectric layer 231 covering the substrate 200, the tops and sidewalls of the first fins 201, and sidewalls of the first dummy gate structure, where the first interlayer dielectric layer 231 may extend from a device region I to an adjacent device region I; after forming the first interlayer dielectric layer 231, forming a first gate opening in the first interlayer dielectric layer 231 by removing the first dummy gate structure; and forming the first gate structure 210 in the first gate opening.

In one embodiment, the second gate structure 220 may be formed in the process of forming the first gate structure 210. The fabrication method for forming the second gate structure 220 may include: forming a second dummy gate structure on the substrate 200 of the device regions I, where the second dummy gate structure may cross the first fins 201 of the device regions I; forming a second gate opening in the first interlayer dielectric layer 231 by removing the second dummy gate structure; and forming the second gate structure 220 in the second gate opening.

In one embodiment, the fabrication method may further include: forming first spacers 241 and second spacers 242. The first spacers 241 may be on the sidewalls of the first gate structure 210 and the second spacers 242 may be on the sidewalls of the second gate structure 220. The top surface of the first gate structure 210 may be coplanar with a top surface of the first spacer 241, and a top surface of the second gate structure 220 may be coplanar with a top surface of the second spacer 242. The first interlayer dielectric layer 231 may cover the sidewalls of the first spacers 241 and the second spacers 242. The second interlayer dielectric layer 232 may also be on the first spacers 241 and the second spacers 242.

In one embodiment, before forming the first interlayer dielectric layer 231, doped source/drain layers 250 may be formed in the first fins 201 on both sides of the first dummy gate structure and the second dummy gate structure. The fabrication method for forming the doped source/drain layers 250 may include: forming recesses respectively in the first fins 201 on the both sides of the first dummy gate structure and the second dummy gate structure; and forming the doped source/drain layers 250 in the recesses epitaxially.

In one embodiment, the first gate structure 210 and the second gate structure 220 may share the source/drain.

In other embodiments, the first gate structure and the second gate structure may not share the source/drain.

In other embodiments, the doped source/drain layers 250 may be formed using an ion implantation process.

In other embodiments, the first gate structure 210 crossing the first fins 201 may be formed on the substrate 200. After forming the first gate structure 210, the doped source/drain layers 250 may be formed in the first fins 201 on the both sides of the first gate structure 210.

After forming the first gate structure 210 and the second gate structure 220, the second interlayer dielectric layer 232 extending from a device region to an adjacent device region may be formed on the surface of the semiconductor substrate 200.

The second interlayer dielectric layer 232 may be used for interlayer isolation.

The second interlayer dielectric layer 232 may cover the surface of the isolation layer 202, the surfaces of the first fins 201, the top surface of the first gate structures 210, the top surface of the second gate structures 220, and the top surfaces and sidewall surfaces of the doped source/drain layers 250.

The first interlayer dielectric layer 231 or the second interlayer dielectric layer 232 may be made of a material including silicon oxide, silicon nitride, silicon boronitride, silicon carbon oxynitride or silicon oxynitride.

A first trench exposing the doped source/drain layer may be formed in the dielectric layer (e.g., in S404 of FIG. 18). The first trench may include a second region and a first region on the second region. A top size of the first region may be larger than a bottom size of the first region, and a maximum size of the second region may be smaller than the bottom size of the first region. A sidewall of the first region may be tilted, and an angle between the sidewall of the first region and the surface of the base substrate may be a first angle b, where the first angle b may be obtuse.

Figure 5:
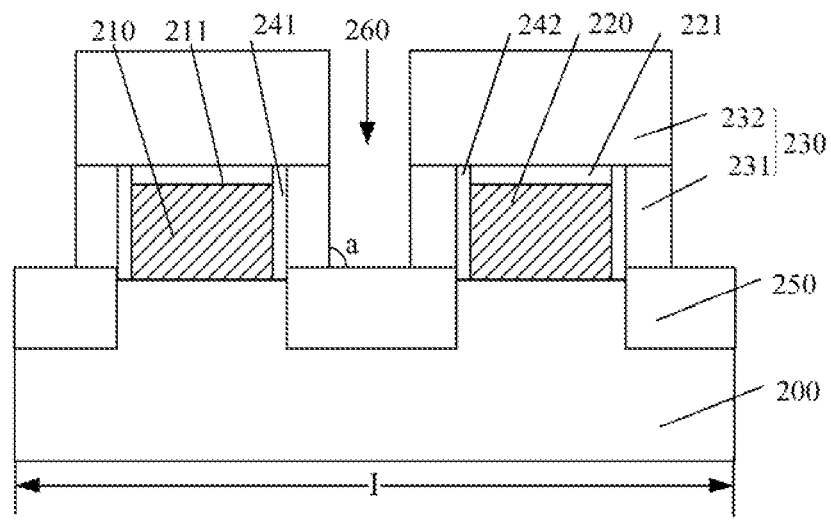

Referring to FIG. 5, a first initial trench 260 may be formed in the dielectric layer 230 and may expose the doped source/drain layer 250.

In one embodiment, the first initial trench 260 may expose a portion of the top surface and sidewall surfaces of the doped source/drain layer 250. The first initial trench 260 may pass through the first interlayer dielectric layer 231 and the second interlayer dielectric layer 232 and may also expose a portion of the top surface of the isolation layer 202.

The first initial trench 260 may provide space for forming the first trench subsequently.

An angle between the sidewall of the first initial trench 260 and the surface of the semiconductor substrate 200 may be a second angle a.

The second angle a may be about 90 degrees to 115 degrees.

In one embodiment, the second angle may be 90 degrees. The sidewall of the first initial trench 260 may be parallel to an extending direction of the substrate normal line.

In other embodiments, the second angle a may be obtuse, and the sidewall of the first initial trench 260 may be tilted.

In one embodiment, the first angle b may be equal to the second angle a. The first region sidewall of the first trench may be parallel to the second region sidewall of the first trench.

The fabrication method of the first trench may include: performing a first etching on the dielectric layer and forming the first trench in the dielectric layer. The sidewall of the first trench may be tilted. The angle between the sidewall of the first trench and the surface of the base substrate may be the first angle.

The first etching process may include the dry etching process. The parameters of the dry etching process may include: applied gases including $CF_4$ and $CH_3F$, a flow rate of $CF_4$ of about 20 sccm to about 200 sccm, a flow rate of $CH_3F$ of about 20 sccm to about 50 sccm, a power of source radio frequency of about 200 W to about 500 W, and a chamber pressure of about 1 torr to 10 torr.

Controlling a ratio of the etching gases may enable the sidewalls of the etched dielectric layer to be tilted, so the sidewalls of the formed first trench may be tilted.

In other embodiments, the second angle a may be less than the first angle b. The sidewall of the first region of the first trench may not be parallel to the sidewall of the second region of the first trench.

In one embodiment, the second angle a may be 90 degrees. The sidewall of the second region of the first trench may be parallel to the extending direction of the substrate normal line.

Figure 6:
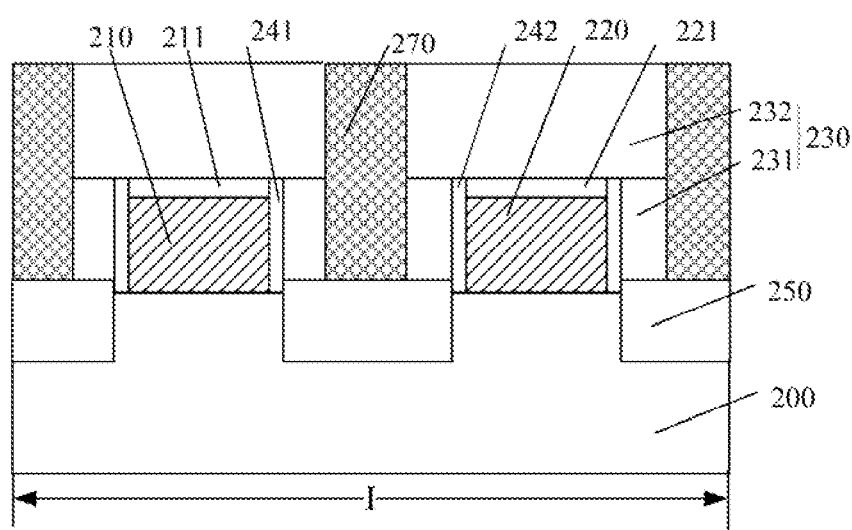
Figure 7:
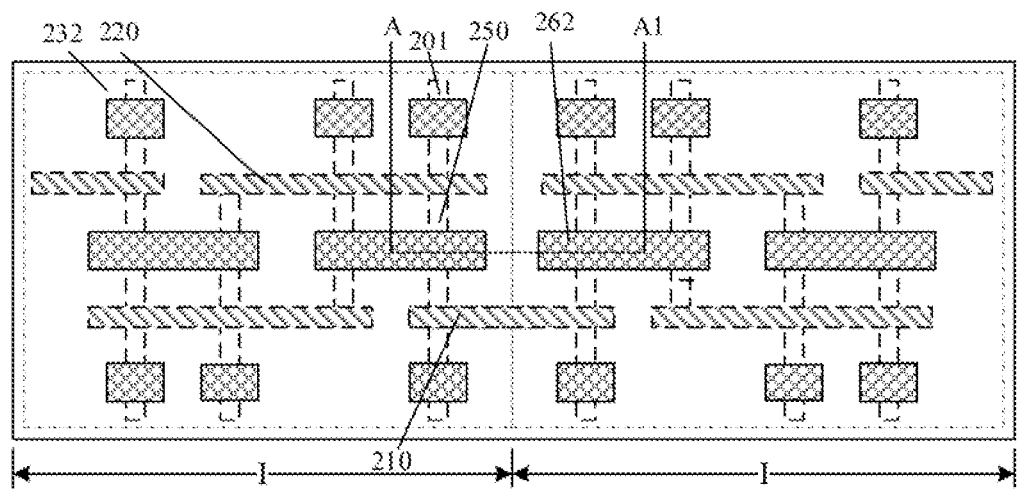
Figure 8:
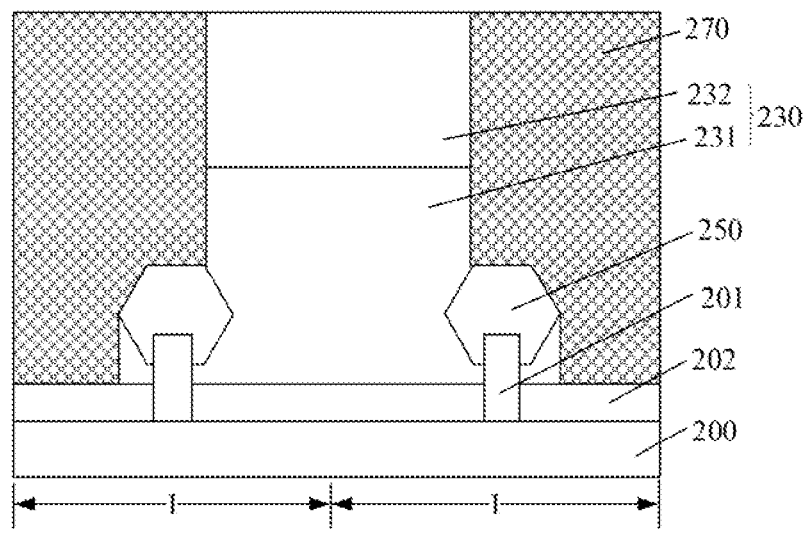

Referring to FIGS. 6-8, the cross-sectional directions of FIG. 5 and FIG. 6 may be consistent. FIG. 7 illustrates a top-view schematic of a semiconductor device, and FIG. 8 illustrates a cross-sectional schematic along a A-A1 direction in FIG. 7. A first initial conductive structure 270 may be formed in the first initial trench 260. A top surface of the first initial conductive structure 270 may be coplanar with a top surface of the dielectric layer 230.

The first initial conductive structure 270 may cover a portion of the tops and the sidewalls of the doped source/drain layers 250.

The first initial conductive structure 270 may provide a material for forming the first conductive structure subsequently.

The method for forming the first initial conductive structure 270 may include: forming a first initial conductive material layer (not shown) in the first initial trench 260 and on the dielectric layer 230; and planarizing the first initial conductive material layer till the top surface of the dielectric layer 230 is exposed and forming the first initial conductive structure 270 in the first initial trench 260.

The first initial conductive structure 270 may be made of a metal including tungsten, cobalt, titanium or nickel.

In one embodiment, the material of the first initial conductive structure 270 may be tungsten.

The first initial conductive material layer may be formed by a deposition process including a chemical vapor deposition process, a physical vapor deposition process or an atomic layer deposition process.

Figure 9:
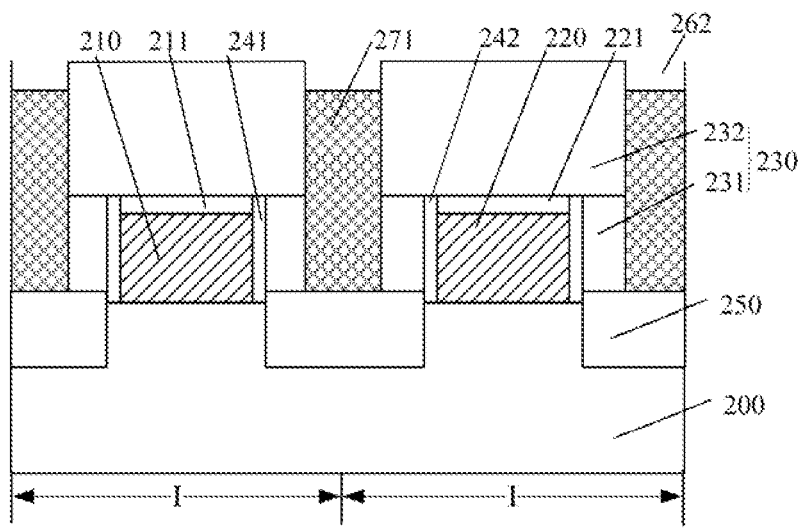
Figure 10:
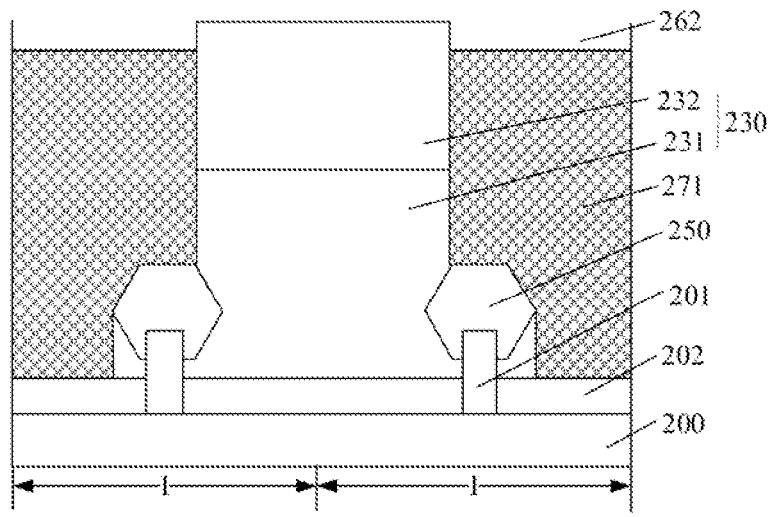

Referring to FIGS. 9-10, the cross-sectional directions of FIG. 9 and FIG. 6 may be consistent, and the cross-sectional directions of FIG. 10 and FIG. 8 may be consistent. After forming the first initial conductive structure 270, a first conductive structure 271 may be formed by etching back a portion of the first initial conductive structure 270 (e.g., in S405 of FIG. 18). A top surface of the first conductive structure 271 may be lower than the top surface of the dielectric layer 230.

The first initial trench exposed by the first conductive structure 271 may be a top region 262 of the first initial trench.

During the formation of the first conductive structure 271, the top region 262 of the first initial trench may be formed. The top region 262 of the first initial trench may be on the first conductive structure 271.

The process of etching back a portion of the first initial conductive structure 270 may be a dry etching process or a wet etching process.

In one embodiment, the portion of the first initial conductive structure 270 may be etched back by the dry etching process.

The first initial trench 260 may include the top region and the bottom region at the bottom of the top region.

The top region 262 of the first initial trench may provide space for forming the first region of the first trench subsequently.

The bottom region of the first initial trench may provide space for the second region of the first trench.

Figure 11:
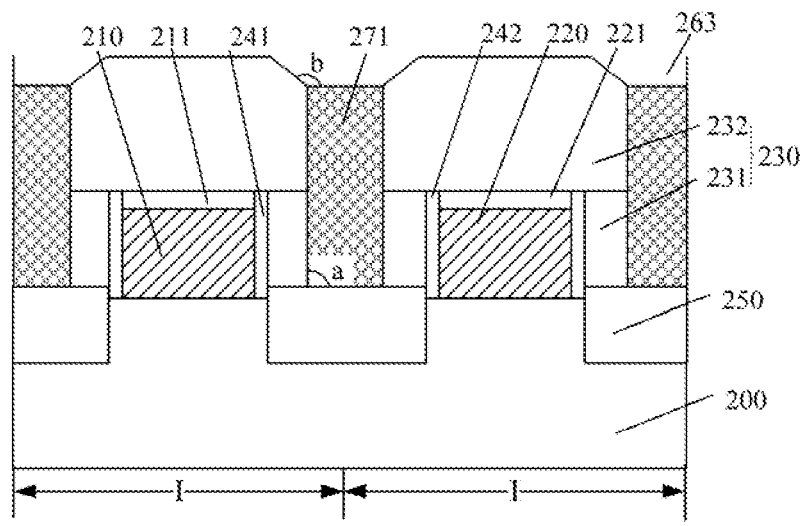
Figure 12:
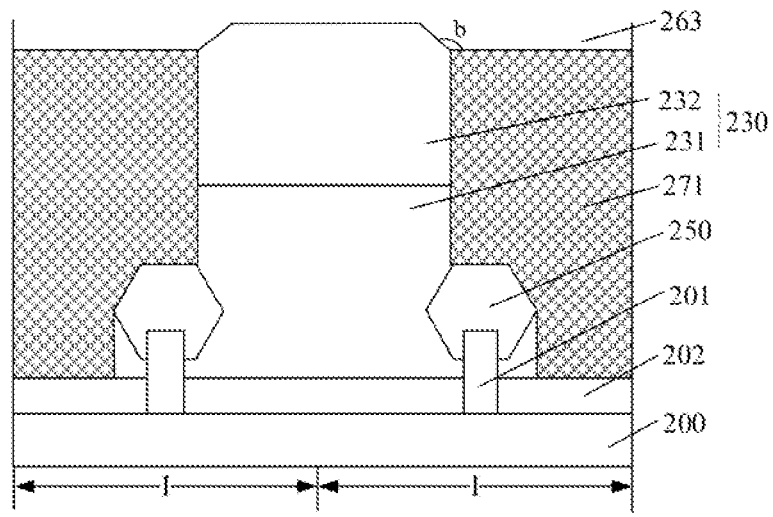

The first conductive structure 271 may in the bottom region of the first initial trench 260, that is, in the second region of the first initial trench, Referring to FIGS. 11-12, the cross-sectional directions of FIG. 11 and FIG. 9 may be consistent, and the cross-sectional directions of FIG. 12 and FIG. 10 may be consistent. After forming the first conductive structure 271, a second etching may be performed on the top and sidewalls of the dielectric layer 230 on both sides of the top region 262 of the first initial trench, so the sidewalls of the top region 262 of the first initial trench may be tilted to form the first region 263 of the first trench.

A bottom surface of the first region 263 of the first trench may be coplanar with the top surface of the first conductive structure 271. The angle between the sidewall of the first region 263 of the first trench and the surface of the base substrate may be the first angle b. The first angle b may be greater than the second angle a. The top size of the first region 263 of the first trench may be larger than the bottom size of the first region 263 of the first trench.

The first angle b may be about 95 degrees to about 115 degrees.

The bottom region of the first initial trench 260 may be the second region of the first trench. The first conductive structure 271 may be in the second region of the first trench.

The first region 263 of the first trench and the second region of the first trench may form the first trench together.

The second etching process may include the dry etching process. The parameters of the dry etching process may include: applied gases including $NH_3$ and $NF_3$, a flow rate of $NH_3$ of about 10 sccm to about 500 sccm, a flow rate of $NF_3$ of about 3 sccm to about 60 sccm, a power of source radio frequency of about 15 W to about 50 W, and a chamber pressure of about 1 torr to 10 torr.

Controlling the ratio of the etching gases may enable the sidewalls of the etched dielectric layer to be tilted, so the sidewalls of the first region of the formed first trench may be tilted. Controlling the ratio of the $NH_3$ gas and the $NF_3$ gas may enable the etching gases to etch the first conductive structure and the dielectric layer selectively, which may reduce the damage to the first conductive structure.

A distance between the first regions 263 of the adjacent first trenches may be about 60 nm to about 80 nm.

An insulation layer may be formed subsequently in the first region of the first trench. The distance between the first regions 263 of the adjacent first trenches of the adjacent device regions may determine a distance between the adjacent insulation layers of the adjacent device regions. Since the recess is formed using the insulation layer as the mask, that is, a top position of the insulation layer may determine a position of the second conductive structure, and the distance between the adjacent insulation layers of the adjacent device regions may determine a size of the second conductive structure formed subsequently. If the distance between the adjacent insulation layers of the adjacent device regions is too small, the second conductive structure may be relatively small which may not meet the device requirement. If the distance between the adjacent insulation layers of the adjacent device regions is too large, the overall size of the device may be relatively large which may not be advantageous for the development trend of device miniaturization.

A difference between the top size of the first region of the first trench and the bottom size of the first region of the first trench may be about 5 nm to about 10 nm.

A distance between an edge of the first region 263 of the first trench and an edge of a corresponding second region of the first trench on a same side may be about 3 nm to about 8 nm.

The distance between the edge of the first region 263 of the first trench and the edge of the corresponding second region of the first trench on the same side may determine the distance between the edge of the insulation layer and the edge of the first conductive structure on the same size, that is, determine the distance between the second conductive structure formed subsequently and the first conductive structure 271.

The distance between the second regions of the adjacent first trenches may be constant. If the difference between the size of the first region 263 of the first trench and the size of the second region of the first trench may be too large, the size of the first region 263 of the first trench may be relatively large. Moreover, the size of the dielectric layer between the first trenches may be relatively small and the size of the second conductive structure in the dielectric layer between the adjacent first trenches may be relatively small, which may cause poor performance of the formed semiconductor device. If the difference between the size of the first region 263 of the first trench and the size of the second region of the first trench may be too small, the difference between the edge of the first region of the first trench and the edge of the second region of the first trench on the same side may be relatively small; the thickness of the dielectric layer between the first conductive structure and the second conductive structure formed subsequently may be relatively small; and the dielectric layer 230 between the first conductive structure and the second conductive structure may be easily broken down, which may cause leakage between the first conductive structure and the second conductive structure.

A ratio of the depth of the first region of the first trench to the depth of the first trench may be about 1:4 to 1:3.

The depth of the first region 263 of the first trench may be about 200 nm to about 350 nm.

The insulation layer may be formed subsequently in the first region 263 of the first trench. The depth of the first region 263 of the first trench may determine a depth of the insulation layer formed subsequently. If the thickness of the insulation layer is too small, the insulation effect may be limited, and leakage may occur between the first conductive structure and second conductive structure. If the depth of the first region 263 of the first trench is too large, the size of the first conductive structure may be too small, which may cause poor performance of the formed semiconductor device.

In one embodiment, the second angle a may be smaller than the first angle b. The method for forming the first trench may include: forming the first initial trench in the dielectric layer, where the first initial trench may expose the doped source/drain layer, and the angle between the sidewall of the first initial trench and the surface of the base substrate may be the second angle; forming the protection layer in the first initial trench, where the top surface of the protection layer may be lower than the top surface of the dielectric layer, and the first initial trench exposed by the protection layer may be the top region of the first initial trench; after forming the protection layer, performing a third etching on the top and sidewalls of the dielectric layer on both sides of the top region of the first initial trench, which may enable the sidewalls of the top region of the first initial trench to be tilted to form the first region of the first trench, where the bottom surface of the first region of the first trench may be coplanar with the top surface of the protection layer, and the angle between the sidewall of the first region of the first trench and the surface of the base substrate may be the first angle; the first angle is greater than the second angle; the top size of the first region of the first trench is larger than the bottom size of the first region of the first trench; and after forming the first region of the first trench, removing the protection layer to form the second region of the first trench.

The protection layer may be made of a material including an organic material.

The method for forming the protection layer may include: forming an initial protection material layer in the first initial trench and on the dielectric layer; planarizing the initial protection material layer till exposing the surface of the dielectric layer to form the initial protection layer; and etching back a portion of the initial protection layer to form the protection layer.

Figure 13:
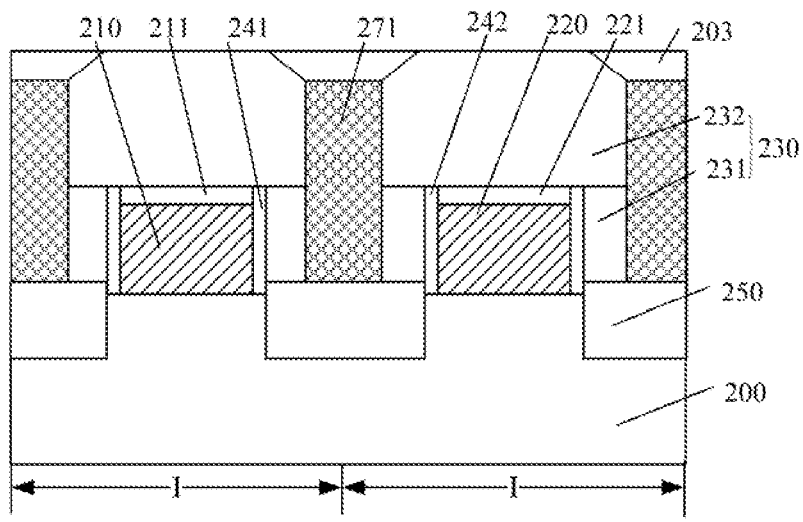
Figure 14:
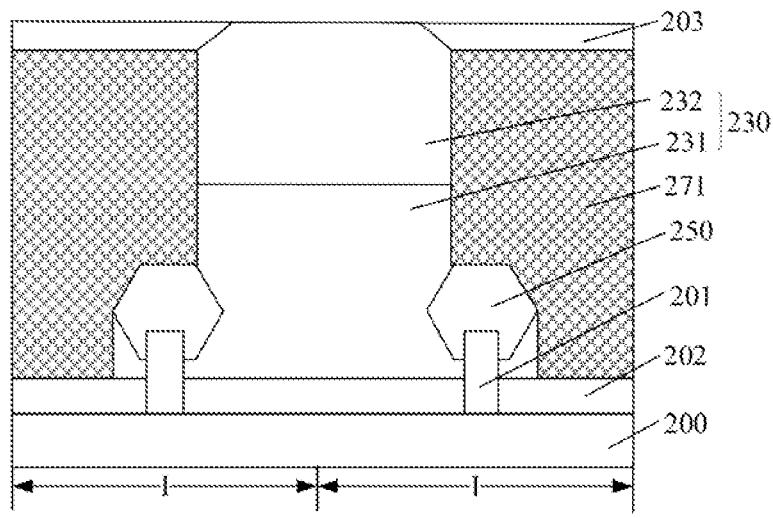

Referring to FIGS. 13-14, the cross-sectional directions of FIG. 13 and FIG. 11 may be consistent, and the cross-sectional directions of FIG. 14 and FIG. 12 may be consistent. an insulation layer 203 may be formed in the first region 263 of the first trench (e.g., in S406 of FIG. 18). The insulation layer 203 may cover the first conductive structure 271, and a top surface of the insulation layer 203 may be coplanar with the top surface of the dielectric layer 230.

The sidewalls of the insulation layer 203 may be tilted. The angle between the sidewall of the insulation layer 203 and the normal line of the semiconductor substrate 200 may be the first angle including an obtuse angle. The first angle may be about 95 degree to about 115 degree.

A top size of the insulation layer 203 may be larger than a bottom size of the insulation layer 203.

A distance between the adjacent insulation layers 203 may be about 60 nm to about 80 nm.

A distance between an edge of the insulation layer 203 and the edge of the corresponding first conductive structure on the same side may be about 3 nm to about 8 nm.

The material of the insulation layer 203 may be different from the material of the dielectric layer 230. At least one insulation layer 203 of the adjacent device regions may be adjacent to each other.

The insulation layer 203 may be made of a material including silicon carbide, silicon carbonitride or silicon oxycarbide.

The method for forming the insulation layer 203 may include: after forming the first conductive structure 270, forming an initial insulation layer (not shown) in the first region 263 of the first trench and on the surface of the dielectric layer 230; and planarizing the initial insulation layer till the top surface of the dielectric layer 230 is exposed and forming the insulation layer 203 in the first region 263 of the first trench.

The material of the insulation layer 203 may be different from the material of the dielectric layer. When forming a recess in the subsequent etching dielectric layer 230, gases having a large etching selectivity for the dielectric layer and the insulation layer may be selected, which may protect the dielectric layer under the insulation layer and ensure that a minimum distance between the first conductive structure 271 and the second conductive structure formed subsequently in the recess may be greater than zero.

In one embodiment, the material of the insulation layer may be silicon carbide.

The insulation layer 203 may cover the top surface of the first conductive structure 271, which may prevent the first conductive structure 271 from being short-circuited with the second conductive structure formed subsequently.

After forming the insulation layer 203, the second conductive structure may be formed in the dielectric layer 230 between the adjacent insulation layers 203. The second conductive structure may be connected to the first gate structure 210.

Figure 15:
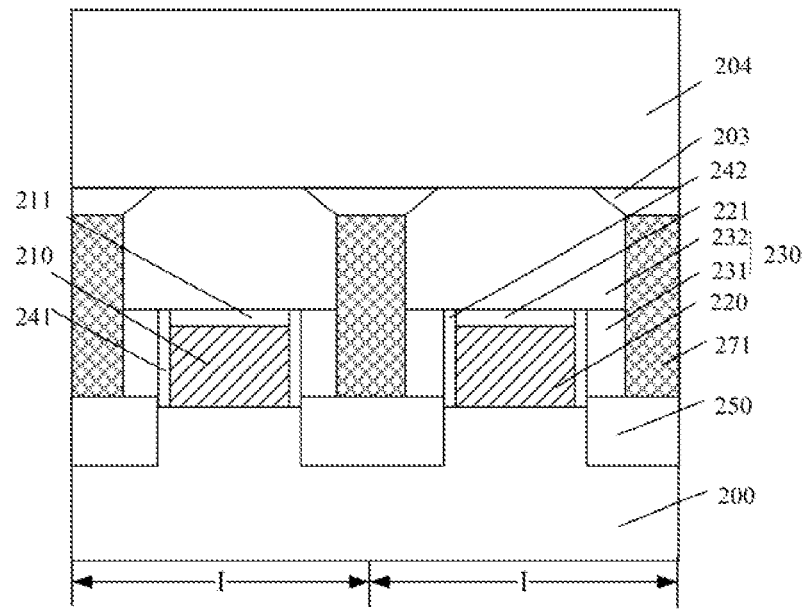
Figure 16:
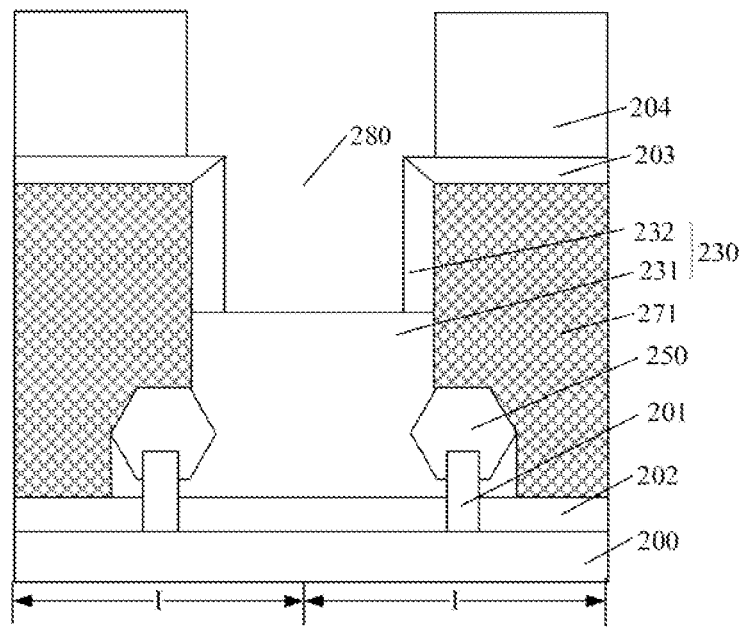

Referring to FIGS. 15-16, the cross-sectional directions of FIG. 15 and FIG. 13 may be consistent, and the cross-sectional directions of FIG. 16 and FIG. 14 may be consistent. A mask layer 204 may be formed on the dielectric layer 230 and the insulation layer 203. The mask layer 204 may expose a portion of the surface of the dielectric layer 230. Using the mask layer 204 and the insulation layer 203 as a mask, the dielectric layer 230 may be etched to form a recess 280 in the dielectric layer (e.g., in S407 of FIG. 18).

The recess 280 may expose a portion of the top surface of the first gate structure 210.

For example, the second dielectric layer 232 between the edges of the first regions 263 of the adjacent first trenches may be etched till the top surface of the first gate structure 210 is exposed, and the recess 280 may be formed in the second dielectric layer 232 between the first regions 263 of the adjacent first trenches.

The recess 280 may provide space for the second conductive structure formed subsequently.

Figure 17:
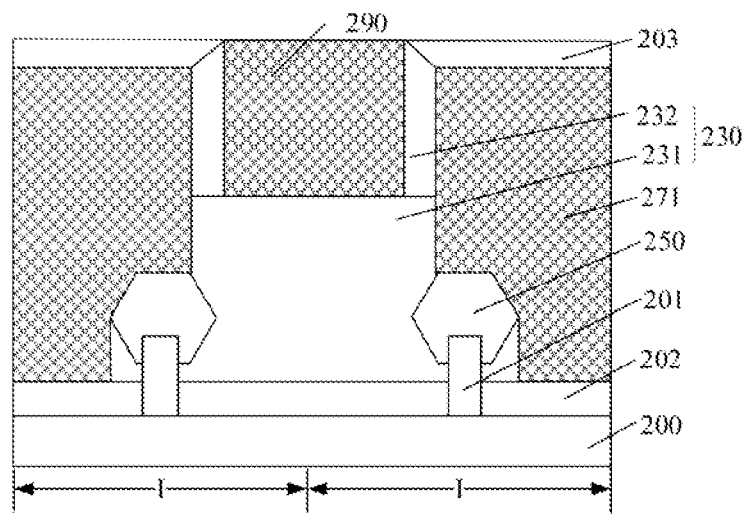
Figure 18:
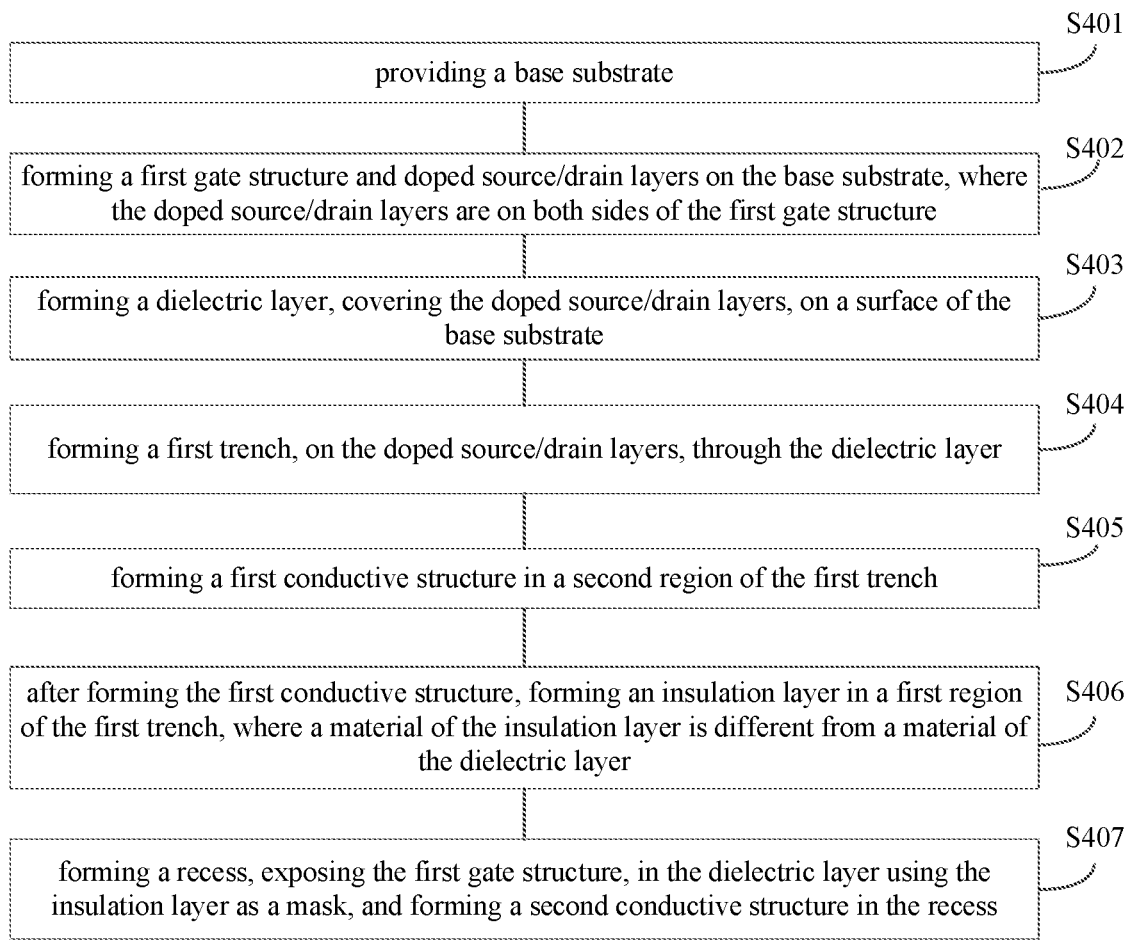
FIG. 18 illustrates a flowchart of an exemplary fabrication method for forming a semiconductor structure according to various disclosed embodiments of the present disclosure.

Referring to FIG. 17, the cross-sectional directions of FIG. 17 and FIG. 16 may be consistent. A second conductive structure 290 may be formed in the recess 280 and may be connected to the first gate structure 210 (e.g., in S407 of FIG. 18).

The second conductive structure 290 may cover a portion of the top surface and sidewall surfaces of the first gate structure 210.

Before forming the second conductive structure 290, the fabrication method may further include removing the first gate protection layer 211 on the top of the first gate structure 210 exposed by the recess 280.

The method for forming the second conductive structure 290 may include: forming the second conductive material layer (not shown) in the recess 280 and on the dielectric layer 230; planarizing the second dielectric material layer till the top surface of the dielectric layer 230 is exposed and forming the second conductive structure 290 in the recess 280.

The second conductive structure 290 may be made of a metal including tungsten, cobalt, titanium or nickel.

In one embodiment, the material of the second conductive structure 290 may be tungsten.

The forming process of the second conductive material layer may be a deposition process such as a chemical vapor deposition process, a physical vapor deposition process or an atomic layer deposition process.

The insulation layer 203 may be formed in the first region 263 of the first trench, and the first conductive structure 271 may be formed in the second region of the first trench. The top size of the first region 263 of the first trench may be larger than the bottom size of the first region 263 of the first trench. The maximum size of the second region of the first trench may be smaller than the bottom size of the first region 263 of the first trench, so the size of the first conductive structure 271 may be smaller than the top size of the insulation layer 203. The recess may be formed using the insulation layer 203 as the mask, that is, the top position of the insulation layer 203 may determine the position of the second conductive structure 290, so the distance between the first conductive structure 271 and the second conductive structure 290 may be greater than zero, and the isolation between the first conductive structure 271 and the second conductive structure 290 may be better. It can be seen that, by controlling the top size of the first region 263 of the first trench and the bottom size of the first region 263 of the first trench, the minimum distance between the first conductive structure 271 and the second conductive structure 290 may be adjusted to prevent leakage between the first conductive structure 271 and the second conductive structure 290. Meanwhile, the insulation layer 203 may cover the top surface of the first conductive structure 271, which may prevent the first conductive structure 271 from being short-circuited with the second conductive structure 290. The above-mentioned method may improve the performance of the semiconductor device.

The present disclosure also provides a semiconductor device formed by any of the above-mentioned embodiments. Referring to FIG. 17, the semiconductor device may include: the semiconductor substrate 200; the first gate structure 210 and the doped source/drain layers 250 on the semiconductor substrate 200, where the doped source/drain layers 250 may be on the both sides of the first gate structure 210; the dielectric layer 230 on the surface of the semiconductor substrate 200, where the dielectric layer 230 may cover the doped source/drain layers 250 (e.g., in S403 of FIG. 18); the first trench, exposing the doped source/drain layers 250, in the dielectric layer 230; the first conductive structure 271 in the second region of the first trench; the insulation layer 203 in the first region of the first trench, where the material of the insulation layer 203 may be different from the material of the dielectric layer 230; and the second conductive structure 290 in the dielectric layer 230 between the insulation layers 203, where the second conductive structure 290 may be connected to the first gate structure 210. The first trench may include the second region and the first region on the second region. The top size of the first region may be larger than the bottom size of the first region, and the maximum size of the second region may be smaller than the bottom size of the first region. The sidewall of the first region may be tilted. The angle between the sidewall of the first region and the normal direction of the semiconductor substrate may be the first angle which may be obtuse.

The semiconductor substrate 200 may refer to the contents of the above-mentioned embodiments of the present disclosure, which may not be described in detail.

The structure, position and material of the first conductive structure 271 may refer to the contents of the above-mentioned embodiments of the present disclosure, which may not be described in detail.

The structure, position and material of the second conductive structure 290 may refer to the contents of the above-mentioned embodiments of the present disclosure, which may not be described in detail.

From the above-mentioned embodiments, it can be seen that the technical solution provided by the present disclosure may achieve at least the following beneficial effects.

In the fabrication method of the semiconductor device provided by the technical solution of the present disclosure, the insulation layer may be formed in the first region of the first trench and the first conductive structure may be formed in the second region of the first trench. For the first region of the first trench, the top size may be larger than the bottom size. The maximum size of the second region of the first trench may be smaller than the bottom size of the first region of the first trench, so the size of the first conductive structure may be smaller than the top size of the insulation layer. The recess may be formed using the insulation layer as the mask, that is, the top position of the insulation layer may determine the position of the second conductive structure, so the distance between the first conductive structure and the second conductive structure may be greater than zero, and the isolation between the first conductive structure and the second conductive structure may be better. It can be seen that, by controlling the top size of the first region of the first trench and the bottom size of the first region of the first trench, the minimum distance between the first conductive structure and the second conductive structure may be adjusted to prevent leakage between the first conductive structure and the second conductive structure. Meanwhile, the insulation layer may cover the top surface of the first conductive structure, which may prevent the first conductive structure from being short-circuited with the second conductive structure. The above-mentioned method may improve the performance of the semiconductor device.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A semiconductor device, comprising:
a base substrate;
a first gate structure and doped source/drain layers on the base substrate, wherein the doped source/drain layers are on both sides of the first gate structure;
a dielectric layer on a surface of the base substrate, wherein the dielectric layer covers the doped source/drain layers, and the dielectric layer contains a first trench on the doped source/drain layer, wherein:
the first trench includes a first region filled by an insulation layer and a second region filled by a first conductive structure under the insulation layer;
a width of a top surface of the insulation layer in the first region is larger than a width of a bottom surface of the insulation layer in the first region;
a maximum width of the first conductive structure in the second region is smaller than the width of the bottom surface of the insulation layer in the first region;
a sidewall of the insulation layer in the first region is tilted; and
an angle between the sidewall of the insulation layer in the first region and a surface of the base substrate is a first angle including an obtuse angle;
a material of the insulation layer is different from a material of the dielectric layer; and
a second conductive structure is in the dielectric layer between insulation layers over adjacent doped source/drain layers, wherein the second conductive structure is connected to the first gate structure.

2. The semiconductor device according to claim 1, wherein:
the insulation layer is formed on a corresponding first conductive structure and on a portion of the dielectric layer surrounding the second conductive structure.

3. The semiconductor device according to claim 1, wherein:
the dielectric layer is made of a material including silicon oxide, silicon nitride, silicon boronitride, silicon carbon oxynitride, silicon oxynitride, or a combination thereof.

4. The semiconductor device according to claim 1, wherein:
the insulation layer is made of a material including silicon carbide, silicon carbonitride, silicon oxycarbide, or a combination thereof.

5. The semiconductor device according to claim 1, wherein:
a minimum distance between adjacent insulation layers over adjacent source/drain layers is about 60 nm to about 80 nm.

6. The semiconductor device according to claim 1, wherein:
a distance between an edge of the insulation layer and an edge of a corresponding first conductive structure on a same side is about 3 nm to about 8 nm.

7. The semiconductor device according to claim 1, wherein:

a difference between the width of the top surface of the first region of the first trench and the width of the bottom surface of the first region of the first trench is about 5 nm to about 10 nm.

8. The semiconductor device according to claim 1, wherein:
a ratio of a depth of the first region of the first trench to a depth of the first trench is about 1:4 to about 1:3.

9. The semiconductor device according to claim 8, wherein:
the depth of the first region of the first trench is about 200 nm to about 350 nm.

10. The semiconductor device according to claim 1, wherein:
an angle between a sidewall of the second region of the first trench and the surface of the base substrate is a second angle, wherein the second angle is smaller than or equal to the first angle.

11. The semiconductor device according to claim 10, wherein:
the first angle is about 95 degrees to about 115 degrees.

12. The semiconductor device according to claim 11, wherein:
the second angle is about 90 degrees to about 115 degrees.

13. The semiconductor device according to claim 10, wherein:
the first angle is equal to the second angle.

14. The semiconductor device according to claim 10, wherein:
the second angle is smaller than the first angle.

15. The semiconductor device according to claim 1, wherein:
the base substrate includes adjacent device regions; each device region of the base substrate has first fins, and the first fins at the adjacent device regions are adjacent; the first gate structure crosses the adjacent device regions; the first gate structure covers a portion of the top and sidewall surfaces of the adjacent first fins; and the doped source/drain layers are in the first fins on both sides of the first gate structure.

* * * * *